United States Patent
Nishimura

(10) Patent No.: US 11,214,892 B2
(45) Date of Patent: Jan. 4, 2022

(54) METHOD FOR MANUFACTURING POLYCRYSTALLINE SILICON FRAGMENT AND METHOD FOR MANAGING SURFACE METAL CONCENTRATION OF POLYCRYSTALLINE SILICON FRAGMENT

(71) Applicant: Tokuyama Corporation, Yamaguchi (JP)

(72) Inventor: Shigeki Nishimura, Yamaguchi (JP)

(73) Assignee: Tokuyama Corporation, Yamaguchi (JP)

( * ) Notice: Subject to any disclaimer, the term of this patent is extended or adjusted under 35 U.S.C. 154(b) by 123 days.

(21) Appl. No.: 16/607,128

(22) PCT Filed: Apr. 19, 2018

(86) PCT No.: PCT/JP2018/016217
§ 371 (c)(1),
(2) Date: Oct. 22, 2019

(87) PCT Pub. No.: WO2018/198947
PCT Pub. Date: Nov. 1, 2018

(65) Prior Publication Data
US 2020/0299860 A1    Sep. 24, 2020

(30) Foreign Application Priority Data

Apr. 24, 2017 (JP) .............................. JP2017-085404

(51) Int. Cl.
| C30B 33/00 | (2006.01) |
| C30B 29/06 | (2006.01) |
| C30B 29/66 | (2006.01) |
| C30B 33/10 | (2006.01) |

(52) U.S. Cl.
CPC .............. *C30B 29/06* (2013.01); *C30B 29/66* (2013.01); *C30B 33/10* (2013.01)

(58) Field of Classification Search
CPC ....... C30B 29/06; C30B 33/00; C01B 33/037; C01B 33/02
See application file for complete search history.

(56) References Cited

U.S. PATENT DOCUMENTS

| 5,346,557 | A | * | 9/1994 | Ito | ..................... H01L 21/02052 134/10 |
| 2006/0042539 | A1 | * | 3/2006 | Ohta | ....................... C30B 15/00 117/13 |
| 2008/0006293 | A1 | * | 1/2008 | Wochner | ............... C01B 33/037 134/2 |
| 2013/0025625 | A1 | * | 1/2013 | Wochner | ............... C01B 33/037 134/3 |
| 2016/0339485 | A1 | * | 11/2016 | Nishimura | .............. C01B 33/02 |

FOREIGN PATENT DOCUMENTS

| JP | H8067511 A | 3/1996 |
| JP | 2006327838 A | 12/2006 |
| JP | 2009179554 A | 8/2009 |
| JP | 2014233653 A | 12/2014 |
| JP | 2016222470 A | 12/2016 |
| WO | 2006126365 A1 | 11/2006 |
| WO | 2016051761 A1 | 4/2016 |

OTHER PUBLICATIONS

English Abstract for JP2009179554 A, Aug. 13, 2009.
English Abstract for JP2016222470 A, Dec. 28, 2016.
Extended European Search Report, dated Jan. 2021.
English Abstract for WO2016051761 A1, Apr. 7, 2016.
English Abstract of WO 20061265 A1, Nov. 30, 2006.
English Abstract of JP201433653 A, Dec. 15, 2014.
English Abstract of JPH8067511 A, Mar. 12, 1996.
English Abstract of JP 2006327838, Dec. 7, 2006.

* cited by examiner

*Primary Examiner* — Robert M Kunemund
(74) *Attorney, Agent, or Firm* — Cahn & Samuels, LLP

(57) ABSTRACT

A method for manufacturing polycrystalline silicon fragments includes producing a polycrystalline silicon rod by the Siemens method; crushing the polycrystalline silicon rod to obtain polycrystalline silicon fragments; and cleaning by etching the polycrystalline silicon fragments in a cleaning tank. In the cleaning, small pieces of the polycrystalline silicon having controlled shapes and sizes are present in the cleaning tank and the weight change of the small pieces of the polycrystalline silicon before and after the etching is measured to thereby manage the cleaning.

16 Claims, No Drawings

METHOD FOR MANUFACTURING POLYCRYSTALLINE SILICON FRAGMENT AND METHOD FOR MANAGING SURFACE METAL CONCENTRATION OF POLYCRYSTALLINE SILICON FRAGMENT

This application is a U.S. national stage application of PCT/JP2018/016217 filed on 19 Apr. 2018 and claims priority to Japanese patent document 2017-085404 filed on 24 Apr. 2017, the entireties of which are incorporated herein by reference.

TECHNICAL FIELD

The present invention relates to a method for manufacturing polycrystalline silicon fragments and a method for managing surface metal concentration of polycrystalline silicon fragments. More specifically, the present invention relates to a method for manufacturing polycrystalline silicon fragments having precisely controlled surface metal concentration and a method for preciously managing the surface metal concentration of the polycrystalline silicon fragments.

BACKGROUND OF THE INVENTION

The Siemens method is known as a method for producing the polycrystalline silicon, which is sometimes referred to as polysilicon. The polycrystalline silicon rod obtained by the Siemens method is crushed to an appropriate size, sorted and used as a raw material for producing single crystal silicon.

An oxide film may be formed on the surface of the crushed material when crushing the polycrystalline silicon rod to obtain polycrystalline silicon fragments. Various foreign metal may adhere to an oxide film formed on the surface of the crushed material, derived from a crusher such as a hammer used for crushing the polycrystalline silicon rod and a classifier such as a sieve.

Oxide films and foreign metal may melt with silicon during the production of single crystal silicon and be incorporated into the produced single crystal silicon. Single crystal silicon, as is well known, changes greatly in its properties due to trace impurities, Therefore, it is required to clean the polycrystalline silicon fragments, remove the oxide films and the foreign metal, and increase the surface cleanliness of the polycrystalline silicon fragments.

As a method for cleaning the surface of the polycrystalline silicon fragments, etching treatment by a fluonitric acid solution is generally known. Not only the oxide film but also the surface of silicon is dissolved by etching with fluonitric acid.

When an etching treatment amount (i.e., the quantity of the surface area of the crushed material removed by etching, which may be referred to as "etching amount") is excessive, etching is performed unnecessarily for a long time, and costs such as operation cost and labor cost are increased. Also, the silicon surface is excessively dissolved to reduce the yield of silicon. Further, since the amount of etching liquid (fluonitric acid solution) used is increased, the cost is increased and the treatment cost of waste liquid is also increased.

On the other hand, the removal of the oxide film may be insufficient if the etching amount is low. Further, since NOx gas is generated in etching treatment by fluonitric acid, cost for treating NOx gas is also required.

Therefore, it is necessary to monitor an appropriate etching amount in a process of cleaning the surface of the polycrystalline silicon fragments.

Patent Document 1 proposes a cleaning method comprising cleaning the polycrystalline silicon fragments with a hydrofluoric acid solution and then etching it with a mixture of hydrofluoric acid and nitric acid (fluonitric acid solution) in order to solve such problems that reduction of silicon yield and solve NOx gas treatment. In the method for cleaning the polycrystalline silicon described in Patent Document 1, the oxide film formed on the surface of the crushed material is removed by cleaning with hydrofluoric acid, thereafter, the crushed material is immersed in an etching solution comprising a fluonitric acid solution to perform a light etching treatment, thereby improving the surface cleanliness of the polycrystalline silicon fragments.

In addition, as a method for measuring the etching amount of the polycrystalline silicon fragments, Patent Document 1 discloses a method comprising etching treatment of sample plate together with polycrystalline silicon fragments, and measuring the thickness of the sample plate before and after etching by a micrometer or measuring the weight of the sample plate material before and after etching treatment. Further in the Patent Document 1, if the thickness and weight of the sample plate before and after etching are measured in advance and the relation between etching time and etching amount is checked, the etching amount of the polycrystalline silicon fragments can be freely adjusted by controlling the etching time without using the sample plate.

However, the material, shape, and size of the sample plate are not described in the Patent Document 1. When etching the sample plate together with the polycrystalline silicon fragments, the sample plate itself may become a baffle and the flow of the etching liquid in the cleaning tank may become uneven. As a result, it is difficult to accurately manage the etching amount of the polycrystalline silicon fragments from the measurement of the thickness and weight of the sample plate because the sample plate cannot be uniformly etched. Further, it is difficult to uniformly etching the polycrystalline silicon fragments, since the flow of the etching liquid become ununiform due to the presence of the sample plate.

Even if the relation between etching time and etching amount is examined in advance, the flow state of the etching liquid is changed depending on the presence/absence of the sample plate, and the etching amount differs depending on the presence/absence of the sample plate. That is, even if the thickness and weight changes of the sample plate are preliminarily linked with the etching time, the etching time may not accurately reflect the etching amount of the polycrystalline silicon fragments because the actual etching condition is different from the condition of the preliminary test. Furthermore, since the etching liquid deteriorates with time, the relation between the etching time and the etching amount examined beforehand may not match with the progress of the actual etching.

CITATION LIST

Patent Document

[Patent Document 1] Japanese Patent No, 4554435

SUMMARY OF INVENTION

In view of the above circumstance, the purpose of the present invention is to provide a method for manufacturing polycrystalline silicon fragments that is able to manage accurately an etching amount by etching both the measurement sample and the polycrystalline silicon fragments uniformly and to the same extent without affecting the flow of the etching solution. Another purpose of the present invention is to provide a method for accurately managing the surface metal concentration of the polycrystalline silicon fragments.

The outline of the present invention for solving the above problem is as follows.

[1] A method for manufacturing polycrystalline silicon fragments comprising;

producing a polycrystalline silicon rod by the Siemens method, crushing the polycrystalline silicon rod to obtain polycrystalline silicon fragments, and cleaning the polycrystalline silicon fragments by etching the silicon fragments in a cleaning tank, characterized in that, in the cleaning step, polycrystalline silicon small pieces having controlled shape and size are present in the cleaning tank, and the weight change of the polycrystalline silicon small pieces before and after the etching is measured to manage the cleaning step.

[2] The method for manufacturing polycrystalline silicon fragments according to [1], wherein the management of the cleaning step is per by calculating the etching rate from the weight change of the polycrystalline silicon small pieces before and after the etching, and adjusting the etching time so as to achieve a target etching amount.

[3] The method for manufacturing polycrystalline silicon fragments according to [1] or [2], wherein the polycrystalline silicon small pieces are cubic or rectangular parallelepiped polycrystalline silicon pieces.

[4] The method for manufacturing polycrystalline silicon fragments according to any one of [1] to [3], wherein the ratio of the total surface area [$cm^2$] of the polycrystalline silicon small pieces before the cleaning step to the resolution [g] of a weight scale measuring the weight of the polycrystalline silicon small pieces (total surface area [$cm^2$] of the polycrystalline silicon small pieces/scale resolution [g]) is $2.0 \times 10^3$ to $3.5 \times 10^7$ [$cm^2/g$].

[5] The method for manufacturing polycrystalline silicon fragments according to [4], wherein the resolution of the scale for measuring the weight before and after etching of the polycrystalline silicon small pieces is 0.1 to 0.0001 g.

[6] The method for manufacturing polycrystalline silicon fragments according to any one of [1] to [5], wherein the polycrystalline silicon small pieces are contained in a container capable of passing liquid and placed in the cleaning tank.

[7] The method for manufacturing polycrystalline silicon fragments according to any one of [1] to [6], wherein the polycrystalline silicon small pieces are dispersively placed in the cleaning tank.

[8] A method for managing a surface metal concentration of crushed fragments of polycrystalline silicon rod produced by the Siemens method comprising;

placing polycrystalline silicon small pieces having controlled shape and size in a cleaning tank in which polycrystalline silicon fragments are cleaned by etching, and measuring the weight change of the polycrystalline silicon small pieces before and after the etching, to thereby managing surface metal concentration of the polycrystalline silicon fragments.

According to the present invention, by using polycrystalline silicon small pieces having controlled shape and size as a measurement sample of the etching amount in the cleaning step, the flow of etching solution is not interfered, and hence, the polycrystalline silicon fragments and the measurement sample can be uniformly etched with the same extent. For this reason, the correlation between the change in the weight of the measurement sample before and after the etching and the etching amount of the polycrystalline silicon fragments is high. Therefore, the etching amount of the polycrystalline silicon fragments can be controlled by managing the change in the weight of the measurement sample. The etching amount of polycrystalline silicon fragments and the surface metal concentration of polycrystalline silicon fragments are also highly correlated. As a result, the surface metal concentration of the polycrystalline silicon fragments can be accurately managed by monitoring the change in the weight of the measurement sample.

Therefore, without excessive etching of the polycrystalline silicon fragments, the oxide film formed on the surface of the polycrystalline silicon fragments and the foreign metal adhering to the oxide film can be reliably removed with the minimum necessary etching amount. In addition, the surface metal concentration of the polycrystalline silicon fragments can be accurately controlled, and high productivity of high-quality polycrystalline silicon fragments is attained.

DETAILED DESCRIPTION OF INVENTION

In the following, each step in the method for manufacturing polycrystalline silicon fragments according to an embodiment of the present invention will be described in detail, and the method for managing surface metal concentration of the silicon fragments will also be described.

Hereinbelow, "the step of producing a polycrystalline silicon rod by the Siemens method" is referred to as "deposition step (1)", "the step of crushing the polycrystalline silicon rod to obtain a polycrystalline silicon fragments" is referred to as "crushing step (2)", and "the step of cleaning the polycrystalline silicon fragments by etching in a cleaning tank" may be referred to as "cleaning step (3)".

Deposition Step (1)

In the deposition step (1), a polycrystalline silicon rod is produced by the Siemens method. The Siemens method is one of methods for producing polycrystalline silicon which is used as a raw material for semiconductors or wafers for photovoltaic power generation. Specifically, a silicon core wire disposed inside a bell jar type reaction vessel is heated to a silicon deposition temperature by energization. Then, a gas of a silane compound such as trichlorosilane ($SiHCl_3$) or mono-silane ($SiH_4$) and hydrogen are supplied to the inside of the reaction vessel, and polycrystalline silicon is deposited on the silicon core wire by chemical vapor deposition to obtain a high purity polycrystalline silicon rod.

The polycrystalline silicon rod thus obtained has a substantially cylindrical shape, and its diameter is not particularly limited, but is usually 100 to 160 mm. The length of the polycrystalline silicon rod is not particularly limited, and that is usually about 1 to 2 m.

Crushing Step (2)

In the crushing step (2), the polycrystalline silicon rod taken out from the reaction vessel is crushed to obtain polycrystalline silicon fragments. Specifically, a polycrystalline silicon rod is crushed with a hammer or jaw crusher made of a hard metal such as tungsten carbide to obtain a raw material polycrystalline silicon lumps, Thereafter, the raw material polycrystalline silicon lumps are further pulverized to a desired particle size by a crushing apparatus composed of a hard polymer or a hard metal to obtain a polycrystalline silicon fragments, After pulverizing the raw material polycrystalline silicon lumps to a desired particle size, those may be classified for each particle size by a classifier such as a sieve or a step deck, if necessary.

Depending on the particle size, the resulting polycrystalline silicon fragments are called dust, powder, chip, nugget, chunk, etc., but there is no strict classification standard. In the present specification, fragments obtained by pulverizing a polycrystalline silicon rod is referred to as "polycrystalline fragments".

Cleaning Step (3)

In the cleaning step (3), the polycrystalline silicon fragments are cleaned by etching in the cleaning tank. Specifically, the polycrystalline silicon fragments are placed in a cleaning tank, and the oxide film formed on the surface of the polycrystalline silicon fragments and the foreign metal adhering to the oxide film are etched and removed by etching using a known etching solution.

The etching solution is not particularly limited. For example, a mixture (fluonitric acid solution) of hydrofluoric acid and nitric acid is used.

The foreign metal is mainly derived from crushing equipment and classification equipment used in the manufacturing process of polycrystalline silicon fragments. Foreign metals include heavy metals such as iron, lead, gold, platinum, silver, copper, chromium, tungsten, nickel, cobalt, zinc, and molybdenum; and light metals such as sodium, potassium, magnesium, aluminum, calcium, titanium, and barium. In addition to the foreign metal, an organic component may adhere to the oxide film formed on the surface of the polycrystalline silicon fragments. Such organic component can also be removed by the cleaning step.

In the present invention, in the Cleaning step (3), polycrystalline silicon small pieces having a controlled shape and size are placed in the cleaning tank, and the weight change of the polycrystalline silicon small pieces before and after the etching treatment is measured to manage the progress of cleaning.

As a measurement sample of the etching amount, by using the polycrystalline silicon small pieces having a controlled shape and size, the polycrystalline silicon fragments can be cleaned without interfering the flow of the etching solution. Therefore, in the cleaning step, the polycrystalline silicon fragments and the measurement sample can be etched uniformly with the same extent, Note that "polycrystalline silicon small pieces having a controlled shape and size" may be simply referred to as "polycrystalline silicon small pieces" or "measurement sample".

According to the present invention, the polycrystalline silicon fragments and the measurement sample can be etched uniformly with the same extent. Therefore, the correlation between the change in the weight of the measurement sample before and after the etching step and the etching amount of the polycrystalline silicon fragments is high, Therefore, the etching amount of polycrystalline silicon fragments can be controlled by monitoring the weight change of the measurement sample. The etching amount of polycrystalline silicon fragments and the surface metal concentration of polycrystalline silicon fragments are also highly correlated. As a result, the surface metal concentration of the polycrystalline silicon fragments can be accurately managed by monitoring the change in the weight of the measurement sample.

In other words, since the measurement sample can be uniformly etched, the etching amount of the measurement sample can be estimated from the change in the weight of the measurement sample before and after the cleaning by etching. In the cleaning step, the polycrystalline silicon fragments and the measurement sample can be etched uniformly with the same extent, so that the etching amount for the measurement sample and the etching amount for the polycrystalline silicon fragments are substantially the same. Therefore, the etching amount of the polycrystalline silicon fragments can be managed by measuring the change in the weight of the measurement sample before and after the etching.

The change in the weight of the polycrystalline silicon small pieces before and after the etching can be measured with an electronic balance or the like. The weight of the polycrystalline silicon small pieces before the etching treatment refers to the weight of the polycrystalline silicon small pieces measured before being immersed in the etching solution. In addition, the weight of the polycrystalline silicon small pieces after the etching treatment means the dry weight of the polycrystalline silicon small pieces taken out from the cleaning tank and washed with water after the etching treatment. The drying may be performed by wiping off water adhering to the polycrystalline silicon small pieces, and using a drying equipment such as a dryer, or vacuum drying.

Preferably, the cleaning step is controlled by calculating the etching rate from the weight change of the polycrystalline silicon small pieces before and after the etching, and then adjusting the treating time of the etching, so as to achieve the target etching amount. The etching amount is appropriately set according to the purity of the target polycrystalline silicon but from the viewpoint of reliably removing the surface oxide and attached metal impurities, the thickness of the surface layer to be removed (i.e., etching amount) is preferably about 3 to 20 μm, more preferably about 6 to 1.5 μm.

The etching rate can be calculated from the weight difference between the measurement samples before and after the etching and the time required for the etching. The etching amount of the polycrystalline silicon fragments can be controlled accurately by feeding back the obtained etching rate to the cleaning step and adjusting treating time (etching time) for etching the measurement sample and polycrystalline silicon fragments, Therefore, the productivity of polycrystalline silicon fragments having excellent surface cleanliness is improved.

Although the etching rate is not particularly limited, it is preferably 0.35 to 10 μm/min, more preferably 0.5 to 2.5 μm/min, based on the thickness of the surface layer to be removed by etching. The etching time is not particularly limited as long as a desired etching amount can be realized, but is preferably 0.8 to 25 minutes, more preferably 3.5 to 20 minutes.

The shape of the individual polycrystalline silicon small piece constituting the polycrystalline silicon small pieces is not particularly limited, in the present invention, it is preferable that all the polycrystalline silicon small piece constituting the polycrystalline silicon small pieces have substantially the same shape. That is, in the "polycrystalline silicon small pieces having a controlled shape" in the preferred embodiment of the present invention, all the polycrystalline silicon pieces constituting the polycrystalline silicon small pieces have substantially the same shape.

The shape of the polycrystalline silicon small piece may be a sphere, a cylinder, a cone, a prism, and a pyramid. The manufacturing method of the polycrystalline silicon small pieces is not particularly limited but can be obtained by cutting a polycrystalline silicon rod. From the viewpoint of easy cutting out from the silicon rod, without interfering the flow of the etching solution, and easy to perform a uniform etching treatment as a measurement sample, a prismatic body is preferable, and among the prismatic bodies, a cube or a rectangular parallelepiped is more preferable, and a cube is particularly preferred.

The size of the polycrystalline silicon small piece is not particularly limited, and it is preferable that all the polycrystalline silicon small piece constituting the polycrystalline silicon small pieces have substantially the same size. In other words, the "polycrystalline silicon small pieces having a controlled size" in the preferred embodiment of the present invention means that all of the polycrystalline silicon small piece constituting the polycrystalline silicon small pieces have the same size. The size of the polycrystalline silicon small piece in the present invention can be evaluated by the surface area of the polycrystalline silicon piece. That is, in a preferred embodiment of the present invention, it is preferable that the individual polycrystalline silicon small piece constituting the polycrystalline silicon small pieces have substantially the same surface area.

The surface area with respect to one polycrystalline silicon piece before the cleaning step is preferably 5 to 10,000 nm$^2$, more preferably 50 to 4500 mm$^2$, and particularly preferably 500 to 2000 mm$^2$. For example, when the shape of the polycrystalline silicon piece is a cube, the surface area of the polycrystalline silicon piece is represented by $6X^2$ [mm$^2$] where the length of one side is X [mm.], There are various methods for measuring the surface area of the polycrystalline silicon piece. For example, when the shape is a cube or a rectangular parallelepiped, it can be calculated by measuring the length of one side with a measuring instrument such as a micrometer.

When the shape of the polycrystalline silicon small piece is a cube or a rectangular parallelepiped, the length of one side of the polycrystalline silicon piece before the cleaning step is preferably 1 to 40 mm, more preferably 3 to 25 mm, still more preferably 5 to 20 mm, and particularly preferably 5 to 15 mm. If the polycrystalline silicon small pieces are too small it will be difficult to cut out with a uniform size, and, since the edge portion of the piece is excessively etched, the relationship between the change in weight of the polycrystalline silicon small pieces and the etching amount of the polycrystalline silicon fragments may not match. In addition, if the polycrystalline silicon piece is too large, the flow of the etching solution may be interfered to cause ununiform etching, and the above relationship may not be consistent.

The polycrystalline silicon small pieces preferably have uniform size. Therefore, the weight variation (CV value) of the polycrystalline silicon small pieces is preferably in the range of 1 to 25%, more preferably 2 to 10%.

The number of polycrystalline silicon small piece constituting the polycrystalline silicon small pieces is not particularly limited, but is preferably 10 to 200, more preferably 50 to 150. When the number of small pieces is too small, it becomes difficult to perform precise measurement because the weight change is small. When the number of small pieces is too large, silicon and etching liquid are excessively consumed to increase the costs, and the flow of etching liquid in the cleaning tank may be interfered.

Table 1 below shows an example of the change in the weight of the polycrystalline silicon small pieces before and after the etching step with respect to the size and number of the polycrystalline silicon small piece. Assuming a polycrystalline silicon cubic piece with a side length of 1 to 38 mm, the weight change (weight difference [Δmg]) of the polycrystalline silicon small pieces generated by the etching with an etching amount of 0.1 μm relative to the size and number of polycrystalline silicon small pieces is calculated. The weight difference Δmg is rounded off to the first decimal place,

TABLE 1

| Polycrystilline silicone small piece | Before etching | After etching of 1 μm | | | | |
|---|---|---|---|---|---|---|
| | | One (1) piece | 10 | 50 | 100 | 150 |
| Length of one side mm | One (1) piece weight g | weight g | Weight difference Δmg | Weight difference Δmg | Weight difference Δmg | Weight difference Δmg | Weight difference Δmg |
| 1 | 0.0023 | 0.0023 | 0.0 | 0.0 | 0.0 | 0.1 | 0.1 |
| 2 | 0.0186 | 0.0186 | 0.0 | 0.0 | 0.1 | 0.3 | 0.4 |
| 3 | 0.0629 | 0.0629 | 0.0 | 0.1 | 0.3 | 0.6 | 0.9 |
| 4 | 0.1491 | 0.1491 | 0.0 | 0.1 | 0.6 | 1.1 | 1.7 |
| 5 | 0.2913 | 0.2912 | 0.0 | 0.2 | 0.9 | 1.7 | 2.6 |
| 6 | 0.5033 | 0.5033 | 0.0 | 0.3 | 1.3 | 2.5 | 3.8 |
| 7 | 0.7992 | 0.7992 | 0.0 | 0.3 | 1.7 | 3.4 | 5.1 |
| 8 | 1.1930 | 1.1929 | 0.0 | 0.4 | 2.2 | 4.5 | 6.7 |
| 9 | 1.6986 | 1.6985 | 0.1 | 0.6 | 2.8 | 5.7 | 8.5 |
| 10 | 2.3300 | 2.3299 | 0.1 | 0.7 | 3.5 | 7.0 | 10.5 |
| 11 | 3.1012 | 3.1011 | 0.1 | 0.8 | 4.2 | 8.5 | 12.7 |
| 12 | 4.0262 | 4.0261 | 0.1 | 1.0 | 5.0 | 10.1 | 15.1 |
| 13 | 5.1190 | 5.1189 | 0.1 | 1.2 | 5.9 | 11.8 | 17.7 |
| 14 | 6.3935 | 6.3934 | 0.1 | 1.4 | 6.9 | 13.7 | 20.8 |
| 15 | 7.8638 | 7.8636 | 0.2 | 1.6 | 7.9 | 15.7 | 23.6 |
| 16 | 9.5437 | 9.6435 | 0.2 | 1.8 | 8.9 | 17.9 | 26.8 |
| 17 | 11.4473 | 11.4471 | 0.2 | 2.0 | 10.1 | 20.2 | 30.3 |
| 18 | 13.5886 | 13.5883 | 0.2 | 2.3 | 11.3 | 22.6 | 34.0 |
| 19 | 15.9815 | 15.9812 | 0.3 | 2.5 | 12.6 | 25.2 | 37.9 |
| 20 | 18.6400 | 18.6397 | 0.3 | 2.8 | 14.0 | 28.0 | 41.9 |
| 21 | 21.5781 | 21.5778 | 0.3 | 3.1 | 15.4 | 30.8 | 46.2 |
| 22 | 24.8098 | 24.8095 | 0.3 | 3.4 | 16.9 | 33.8 | 50.7 |
| 23 | 28.3491 | 28.3487 | 0.4 | 3.7 | 18.5 | 37.0 | 55.5 |
| 24 | 32.2099 | 32.2095 | 0.4 | 4.0 | 20.1 | 40.3 | 60.4 |
| 25 | 36.4063 | 36.4058 | 0.4 | 4.4 | 21.8 | 43.7 | 65.5 |
| 26 | 40.9521 | 40.9516 | 0.5 | 4.7 | 23.6 | 47.3 | 70.9 |
| 27 | 45.8614 | 45.8609 | 0.5 | 5.1 | 25.5 | 51.0 | 76.4 |

TABLE 1-continued

| Polycrystilline silicone small piece | Before etching | After etching of 1 μm | | | | |
|---|---|---|---|---|---|---|
| | | One (1) piece | 10 | 50 | 100 | 150 |
| Length of one side mm | One (1) piece weight g | weight g | Weight difference ⊿ mg | Weight difference ⊿ mg | Weight difference ⊿ mg | Weight difference ⊿ mg |
| 28 | 51.1482 | 51.1476 | 0.5 | 5.5 | 27.4 | 54.8 | 82.2 |
| 29 | 56.8264 | 56.6258 | 0.6 | 5.9 | 29.4 | 58.8 | 88.2 |
| 30 | 62.9100 | 62.9094 | 0.6 | 6.3 | 31.5 | 62.9 | 84.4 |
| 31 | 69.4130 | 69.4124 | 0.7 | 6.7 | 33.6 | 67.2 | 100.8 |
| 32 | 76.3494 | 76.3487 | 0.7 | 7.2 | 35.8 | 71.6 | 107.4 |
| 33 | 83.7332 | 83.7324 | 0.8 | 7.6 | 38.1 | 76.1 | 114.2 |
| 34 | 91.5783 | 91.5775 | 0.8 | 8.1 | 40.4 | 80.8 | 121.2 |
| 35 | 99.8988 | 99.8979 | 0.9 | 8.6 | 42.8 | 85.6 | 128.4 |
| 36 | 108.7085 | 108.7076 | 0.9 | 9.1 | 45.3 | 90.6 | 135.9 |
| 37 | 118.0215 | 118.0205 | 1.0 | 9.6 | 47.8 | 95.7 | 143.5 |
| 38 | 127.6518 | 127.8508 | 1.0 | 10.1 | 50.5 | 100.9 | 151.4 |

As shown in Table 1, when using a polycrystalline silicon small pieces with a side length of 1 mm, if the etching amount is 0.1 μm, the weight change is small even with 50 pieces and if the number of pieces is 100, it turns out that a weight change will be about 0.1 mg. Therefore, it can be seen from Table 1 that by adjusting the size and number of the measurement samples, it is possible to detect a change in weight due to 0.1 μm etching by measuring the weight of the measurement sample before and after the etching step. In the present invention, because the etching amount of the measurement sample and the etching amount of the polycrystalline silicon fragments can be regarded as substantially the same amount, the etching amount of the polycrystalline fragments can be managed by monitoring the weight change of the polycrystalline silicon small pieces before and after the cleaning by etching.

In particular, from the viewpoint of the fluidity of the etching solution, the viewpoint of the amount of etching solution used and the view point that the weight change of the measurement sample can be measured more accurately, it is preferable to select the size and number of polycrystalline silicon small pieces so that a change in weight due to etching of 0.1 μm can be detected by a change in weight of about frog. A large weight change improves the accuracy of measurement but consumes excessive silicon and etching solution and increases the costs. Therefore, it is preferable to select the size and number of polycrystalline silicon small pieces so that the weight change due to the etching of 0.1 μm is preferably 0.9 mg or more, further preferably 0.9 to 45.0 mg, particularly preferably 1.5 to 30.0 mg.

In addition, the ratio of the total surface area [cm$^2$] of the polycrystalline silicon small pieces before the cleaning step and the resolution [g] of the weight scale for measuring the weight of the polycrystalline silicon small pieces (total surface area [cm$^2$] of the polycrystalline silicon small pieces/resolution of the scale [g]) is preferably $2.0 \times 10^3$ to $3.5 \times 10^7$ [cm$^2$/g], more preferably $5.0 \times 10^3$ to $5.0 \times 10^6$ [cm$^2$/g]. The total surface area [cm$^2$] of the polycrystalline silicon small pieces means the total surface area of all the polycrystalline silicon pieces constituting the polycrystalline silicon small pieces. The resolution of the weight scale is the ability to identify the difference in mass values that are close to each other, and that is expressed as the minimum display/capacity. Smaller means higher resolution and better accuracy.

By setting the ratio of the total surface area [cm$^2$] of the polycrystalline silicon small pieces before the cleaning step to the resolution [g] of the weight scale for measuring the weight of the polycrystalline silicon small pieces within the above range, since the change in weight of the polycrystalline silicon small pieces before and after the etching step can be accurately measured, the etching amount of the polycrystalline silicon small pieces can be easily managed. As a result, the etching amount of the polycrystalline silicon fragments can be accurately managed.

When the ratio of the total surface area [cm$^2$] of the polycrystalline silicon small pieces before the cleaning step and the resolution [g] of the scale for measuring the weight of the polycrystalline silicon small pieces is within the above range, the resolution of the scale for measuring the weight of the polycrystalline silicon small pieces before and after the etching treatment is preferably 0.1 to 0.0001 g, more preferably 0.01 to 0.001 g.

Further, in the cleaning step, it is preferable that the polycrystalline silicon small pieces are contained in a container capable of passing liquid and placed in the cleaning tank. By holding the polycrystalline silicon small pieces in a container capable of passing liquid and placing it in a cleaning tank, handling during weight measurement becomes easy. Moreover, the fluidity of the etching solution in the cleaning tank is also kept good. As a result, the polycrystalline silicon fragments and the polycrystalline silicon small pieces can be etched more uniformly.

The container capable of passing liquid is not particularly limited, and examples thereof include a resin net or a basket. From the viewpoint of high resistance to the etching solution and easy availability, a net made of a fluororesin (fluorocarbon resin) is preferable.

The filling rate of the polycrystalline silicon small pieces into the liquid-permeable container is not particularly limited but is preferably 50% or less. When the filling rate exceeds 50%, the flow of the etching solution may be interfered by the polycrystalline silicon small pieces.

In the cleaning step, it is preferable to place the polycrystalline silicon small pieces in a cleaning tank dispersively. By arranging in this way, the average etching rate in the cleaning tank can be calculated, so that the etching amount of the polycrystalline silicon fragments can be managed with high accuracy.

In addition, the surface cleanliness of the polycrystalline silicon small pieces may be improved before cleaning step. Specifically, the polycrystalline silicon small pieces are etched in a cleaning tank to remove the oxide film, foreign metal adhering to the oxide film, and the like.

By using the measurement sample with improved surface cleanliness in the cleaning step, it is possible to measure a change in weight due to dissolution of the silicon surface only. Therefore, the variation in weight change before and after the etching step due to the presence or absence of an oxide film, foreign metal, etc. is suppressed, and the etching amount of the polycrystalline silicon fragments can be easily managed by monitoring the change in the weight of the measurement sample.

In addition, when the etching treatment of the polycrystalline silicon small pieces is not performed before the cleaning step, the polycrystalline silicon small pieces on which an oxide film or the like remains are used as a measurement sample. In this case, since the polycrystalline silicon fragments and the measurement sample have an oxide film or the like on the surface, the etching amount of the polycrystalline silicon fragments and the etching amount of the measurement sample in the cleaning step are equal, and the etching amount of the polycrystalline silicon fragments is easily managed.

In addition, according to the method for managing the surface metal concentration of the crushed fragments of polycrystalline silicon rod as described above, by measuring the weight change of the measurement sample before and after the etching treatment, the surface metal concentration of the polycrystalline silicon fragments can be managed accurately and easily.

For example, by increasing the etching amount, the surface metal concentration of the obtained polycrystalline silicon fragments can be lowered. Accordingly, in a preferred embodiment of the present invention, the total concentration of surface metals such as Fe, Cr, Ni, Na, Zn, Al, Cu, Mg, Ti, W, K, Co, and Ca can be 0.250 ppbw or less. More preferably, it is 0.230 ppbw or less, particularly preferably 0.100 ppbw or less, and most preferably 0.050 ppbw or less.

In addition, in a preferred embodiment of the present invention, a polycrystalline silicon fragments having a surface Fe concentration of 0.050 ppbw or less is obtained.

In a preferred embodiment of the present invention, a polycrystalline silicon fragments having a surface Cu concentration of 0.005 ppbw or less is obtained.

In a preferred embodiment of the present invention, a polycrystalline silicon fragments having a surface W concentration of 0.040 ppbw or less is obtained.

EXAMPLE

Hereinafter, the present invention will be described in more detail with reference to examples, but the present invention is not limited to these examples.

The surface metal contamination amount of the polycrystalline silicon fragments is a value determined as follows.
1) Surface Metal Contamination of Polycrystalline Silicon Fragments 40 g of polycrystalline silicon fragments obtained in the following example is transferred to a clean 500 ml-beaker made of polytetrafluoroethylene, and 100 ml of solution (50 wt % —HF: 10 ml, 70 wt %-nitric acid: 90 ml) is added and extracted at 25° C. for 15 minutes. The liquid in the beaker was taken out as an extraction liquid, and the surface of the polycrystalline silicon fragments were washed with 100 ml of ultrapure water. The extraction liquid and the washing solution were transferred to a clean polytetrafluoroethylene beaker to obtain a surface extract of polycrystalline silicon fragments. The surface extract of the polycrystalline silicon fragments was evaporated to dryness, added with 3.5% by weight nitric acid aqueous Solution to make 20.0 ml, and ICP-MS measurement was performed and then the surface metal masses of Na, Mg, Al, K, Ca, Cr, Fe, Ni, Co, Cu, Zn, W, and Ti were measured. The measured value of each surface metal mass was divided by 40 g to evaluate the content per unit weight (ppbw) of the polycrystalline silicon fragments. The ICP-MS measuring device "7500 CS" manufactured by Agilent was used.

Example 1

A polycrystalline silicon rod is manufactured in the reduction reaction furnace by the Siemens method. After introducing air through a HEPA (High Efficiency Particulate Air) filter into the furnace, the furnace was opened to the atmosphere, and the polycrystalline silicon rod was taken out of the furnace. The removed polycrystalline silicon rod was crushed by a hammer so as to be crushed fragments, in which at least 90 mass % thereof have a major axis length in the range of 10 to 120 mm. The material of the striking part of the hammer mentioned above was made of tungsten carbide/cobalt alloy (tungsten carbide content 82 mass %, cobalt content 18 mass %), 5 kg of the obtained polycrystalline silicon fragments was contained in a resin basket. The polycrystalline silicon small pieces consisting of 50 cubic silicon pieces with a side length of about 7 mm were also housed in a polytetrafluoroethylene (PTFE) net, and placed in the resin basket for measuring the etching amount. In addition, prior to placing the polycrystalline silicon small pieces in the resin basket, the total of dry mass was measured in advance.

The resin basket containing the polycrystalline silicon fragments mentioned above was immersed in a cleaning tank containing a fluonitric acid aqueous solution (liquid temperature 20° C.) in which 50 wt % hydrofluoric acid and 70 wt % nitric acid were mixed at a volume ratio of 1:8. The surface of the polycrystalline silicon fragments was etched by holding for a certain period of time, and then the resin basket was taken out from the cleaning tank, washed with ultrapure water, and, dried by blowing. After drying, polycrystalline silicon small pieces were taken out from the resin basket, the total mass thereof was measured, and the weight difference before and after the cleaning step was determined to be 38 mg. Based on the weight difference of the polycrystalline silicon small pieces before and after this cleaning step and the total surface area of the polycrystalline silicon small pieces, the thickness of the surface layer removed by etching (etching amount) of the polycrystalline silicon fragments was calculated as 1.1 μm.

Furthermore, the polycrystalline silicon fragments after the cleaning step were taken out from the resin basket, and the surface metal contamination amount was measured. The measurement results of the surface metal contamination amount are shown in Table 2.

Example 2

The polycrystalline silicon fragments were cleaned by the same method as in Example 1, except that the immersion time of the resin basket containing the polycrystalline silicon fragments in the fluonitric acid aqueous solution is longer than that in example 1, and the etching amount of the polycrystalline silicon fragments calculated from the weight difference between before and after the cleaning step of the polycrystalline silicon small pieces was 3.2 μm. Table 2 shows the results of measuring the amount of surface metal contamination of the obtained polycrystalline silicon fragments.

Example 3

The polycrystalline silicon fragments were cleaned by the same method as in Example 2, except that the immersion time of the resin basket containing the polycrystalline silicon fragments in the fluonitric acid aqueous solution is longer than that in Example 2, and the etching amount of the polycrystalline silicon fragments calculated from the weight difference between before and after the washing step of the polycrystalline silicon small pieces was 6.5 μm. Table 2 shows the results of measuring the amount of surface metal contamination of the obtained polycrystalline silicon fragments.

TABLE 2

|  |  | Example 1 | Example 2 | Example 3 |
|---|---|---|---|---|
| Difference in weight before and after cleaning of polycrystalline silicon small | | 38 mg | 107 mg | 220 mg |
| Calculated etching amount | | 1.1 μm | 3.2 μm | 6.5 μm |
| Surface metal concentration | Na [ppbw] | 0.026 | 0.002 | 0.001 |
| | Mg [ppbw] | 0.004 | 0.003 | 0.001 |
| | Al [ppbw] | 0.009 | 0.002 | 0.002 |
| | K [ppbw] | 0.004 | 0.002 | 0.001 |
| | Ca [ppbw] | 0.041 | 0.006 | 0.005 |
| | Cr [ppbw] | 0.004 | 0.001 | 0.002 |
| | Fe [ppbw] | 0.045 | 0.009 | 0.005 |
| | Ni [ppbw] | 0.001 | 0.001 | 0.001 |
| | Co [ppbw] | 0.005 | 0.001 | 0.001 |
| | Cu [ppbw] | 0.004 | 0.001 | 0.001 |
| | Zn [ppbw] | 0.003 | 0.002 | 0.002 |
| | W [ppbw] | 0.037 | 0.025 | 0.013 |
| | Ti [ppbw] | 0.049 | 0.018 | 0.007 |
| Total surface metal concentration [ppbw] | | 0.232 | 0.073 | 0.042 |

The invention claimed is:

1. A method for manufacturing polycrystalline silicon fragments comprising:
    producing a polycrystalline silicon rod by the Siemens method,
    crushing the polycrystalline silicon rod to obtain polycrystalline silicon fragments, and
    cleaning the polycrystalline silicon fragments by etching in a cleaning tank,
    wherein, in the cleaning step, polycrystalline silicon pieces having a controlled shape and size that are separately obtained from said polycrystalline silicon fragments are placed in the cleaning tank, and the weight change of the polycrystalline silicon pieces before and after the etching is measured to manage the cleaning step.

2. The method for manufacturing polycrystalline silicon fragments according to claim 1, wherein the management of the cleaning step is performed by calculating the etching rate from the weight change of the polycrystalline silicon pieces before and after the etching, and adjusting the etching time so as to achieve a target etching amount.

3. The method for manufacturing polycrystalline silicon fragments according to claim 1, wherein the polycrystalline silicon pieces are cubic or rectangular parallelepiped polycrystalline silicon pieces.

4. The method for manufacturing polycrystalline silicon fragments according to claim 1, wherein the ratio of the total surface area of the polycrystalline silicon pieces before the cleaning step to the resolution of a weight scale measuring the weight of the polycrystalline silicon pieces, total surface area [cm$^2$] of the polycrystalline silicon small pieces/scale resolution [g], is $2.0 \times 10^3$ to $3.5 \times 10^7$ [cm$^2$/g].

5. The method for manufacturing polycrystalline silicon fragments according to claim 4, wherein the resolution of the scale for measuring the weight before and after etching of the polycrystalline silicon pieces is 0.1 to 0.0001 g.

6. The method for manufacturing polycrystalline silicon fragments according to claim 1, wherein the polycrystalline silicon pieces are contained in a container capable of passing liquid and placed in the cleaning tank.

7. The method for manufacturing polycrystalline silicon fragments according to claim 1, wherein the polycrystalline silicon pieces are dispersively placed in the cleaning tank.

8. A method for managing a surface metal concentration of crushed fragments of polycrystalline silicon rod produced by the Siemens method comprising:
    placing polycrystalline silicon pieces having controlled shape and size in a cleaning tank in which polycrystalline silicon fragments are cleaned by etching, and
    measuring the weight change of the polycrystalline silicon pieces before and after the etching, to thereby managing surface metal concentration of the polycrystalline silicon fragments.

9. The method for manufacturing polycrystalline silicon fragments according to claim 1, wherein a surface area with respect to one polycrystalline silicon piece before the cleaning step is 5 to 10,000 mm$^2$.

10. The method for manufacturing polycrystalline silicon fragments according to claim 1, wherein a number of polycrystalline silicon pieces is 10 to 200.

11. The method for manufacturing polycrystalline silicon fragments according to claim 1, wherein the polycrystalline silicon pieces are obtained by cutting a polycrystalline silicon rod.

12. A method for manufacturing polycrystalline silicon fragments comprising:
    producing a polycrystalline silicon rod by the Siemens method;
    crushing the polycrystalline silicon rod to obtain polycrystalline silicon fragments;
    placing the polycrystalline silicon fragments in a cleaning tank;
    placing polycrystalline silicon pieces having a controlled shape and size in the cleaning tank, said polycrystalline silicon pieces being separately obtained from said polycrystalline silicon fragments;
    etching the polycrystalline silicon fragments and the polycrystalline silicon pieces; and
    measuring a weight change of the polycrystalline silicon pieces before and after said etching to control an etching amount of the polycrystalline silicon fragments.

13. The method for manufacturing polycrystalline silicon fragments according to claim 12, wherein controlling the etching amount comprises calculating an etching rate and adjusting a treatment time for etching.

14. The method for manufacturing polycrystalline silicon fragments according to claim 12, wherein a surface area with respect to one polycrystalline silicon piece before the etching is 5 to 10,000 mm$^2$.

15. The method for manufacturing polycrystalline silicon fragments according to claim 12, wherein a number of polycrystalline silicon pieces is 10 to 200.

16. The method for manufacturing polycrystalline silicon fragments according to claim 12, the polycrystalline silicon pieces are cubic.

\* \* \* \* \*